(12) United States Patent
Wallace

(10) Patent No.: US 6,639,309 B2
(45) Date of Patent: Oct. 28, 2003

(54) MEMORY PACKAGE WITH A CONTROLLER ON ONE SIDE OF A PRINTED CIRCUIT BOARD AND MEMORY ON ANOTHER SIDE OF THE CIRCUIT BOARD

(75) Inventor: Robert F. Wallace, Sunnyvale, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/112,968

(22) Filed: Mar. 28, 2002

(65) Prior Publication Data

US 2003/0183914 A1 Oct. 2, 2003

(51) Int. Cl.⁷ ............................................... H01L 23/02
(52) U.S. Cl. .................... 257/678; 257/723; 257/724; 257/777; 257/679; 365/52
(58) Field of Search ................. 257/678, 679, 257/723, 724, 777; 438/106, 107, 109, 110, 121; 365/185.02–185.04, 185.09, 185.11, 185.22, 185.28, 185.29, 52, 221

(56) References Cited

U.S. PATENT DOCUMENTS

| 5,070,032 A | 12/1991 | Yuan et al. .................... 437/43 |
| 5,095,344 A | 3/1992 | Harari ......................... 357/23.5 |
| 5,168,465 A | 12/1992 | Harari ......................... 257/320 |
| 5,198,380 A | 3/1993 | Harari ......................... 437/43 |
| 5,268,318 A | 12/1993 | Harari ......................... 437/43 |
| 5,268,319 A | 12/1993 | Harari ......................... 437/43 |
| 5,313,421 A | 5/1994 | Guterman et al. .......... 365/185 |
| 5,343,063 A | 8/1994 | Yuan et al. ................. 257/317 |
| 5,380,672 A | 1/1995 | Yuan et al. .................... 437/43 |
| 5,512,505 A | 4/1996 | Yuan et al. .................... 437/43 |
| 5,534,456 A | 7/1996 | Yuan et al. .................... 437/43 |
| 5,554,553 A | 9/1996 | Harari ......................... 437/43 |
| 5,579,259 A | 11/1996 | Samachisa et al. .... 365/185.14 |
| 5,595,924 A | 1/1997 | Yuan et al. .................... 437/43 |
| 5,654,217 A | 8/1997 | Yuan et al. ................. 438/588 |
| 5,661,053 A | 8/1997 | Yuan ........................... 437/43 |
| 5,663,901 A * | 9/1997 | Wallace et al. ............... 365/52 |
| 5,677,872 A | 10/1997 | Samachisa et al. .... 365/185.14 |
| 5,703,395 A * | 12/1997 | Berney ........................ 257/681 |
| 5,712,179 A | 1/1998 | Yuan ........................... 437/43 |
| 5,747,359 A | 5/1998 | Yuan et al. ................. 437/186 |
| 5,756,385 A | 5/1998 | Yuan et al. ................. 438/258 |
| 5,786,988 A | 7/1998 | Harari ......................... 361/749 |
| 5,847,425 A | 12/1998 | Yuan et al. ................. 257/315 |
| 5,867,429 A | 2/1999 | Chen et al. ............. 365/185.33 |
| 5,883,409 A | 3/1999 | Guterman et al. .......... 257/316 |
| 5,965,913 A | 10/1999 | Yuan et al. ................. 257/321 |
| 6,028,336 A | 2/2000 | Yuan ........................... 257/315 |
| 6,040,622 A * | 3/2000 | Wallace ....................... 257/679 |
| 6,046,935 A * | 4/2000 | Takeuchi et al. ........ 365/185.03 |
| 6,081,447 A * | 6/2000 | Lofgren et al. ......... 365/185.02 |
| 6,103,573 A | 8/2000 | Harari et al. ................. 438/257 |
| 6,151,248 A | 11/2000 | Harari et al. .......... 365/185.14 |
| 6,208,545 B1 | 3/2001 | Leedy ........................ 365/51 |
| 6,222,265 B1 * | 4/2001 | Akram et al. ................ 257/723 |
| 6,426,893 B1 * | 7/2002 | Conley et al. .......... 365/185.11 |

OTHER PUBLICATIONS

U.S. patent application Ser. No. 09/667,344, Yuan et al., filed Sep. 22, 2000.

* cited by examiner

Primary Examiner—David Nelms
Assistant Examiner—Long Tran
(74) Attorney, Agent, or Firm—Parsons Hsue & de Runtz LLP

(57) ABSTRACT

A memory chip package with a controller die on a first side of a printed circuit board and a memory die on a second side of the same printed circuit board. The memory chip package is integrated into a microprocessor controlled device or alternatively is integrated into a portable memory card.

30 Claims, 5 Drawing Sheets

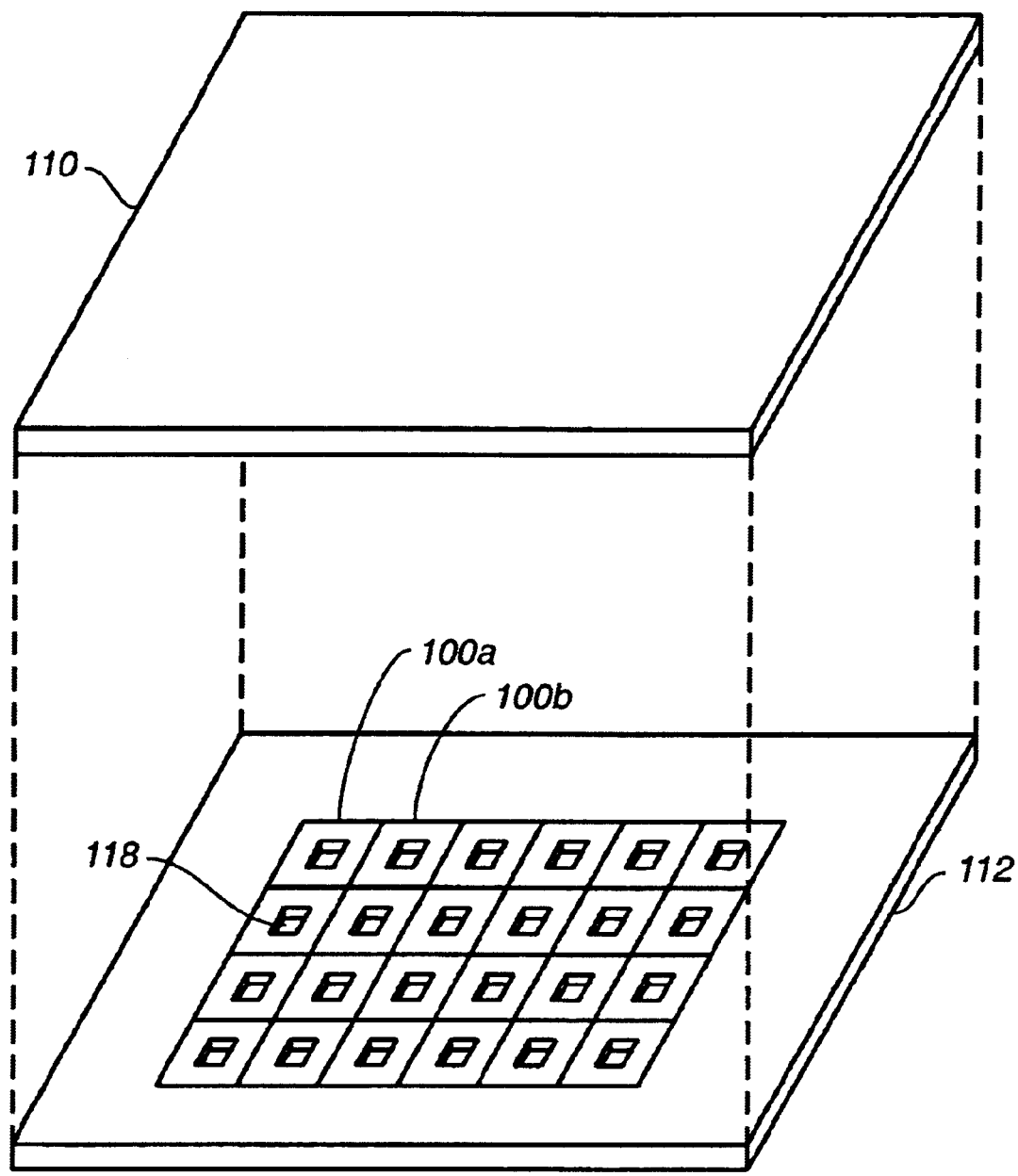
FIG._1

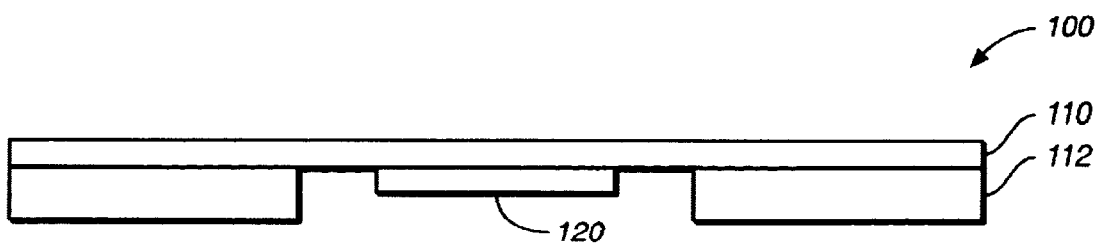
FIG._2a
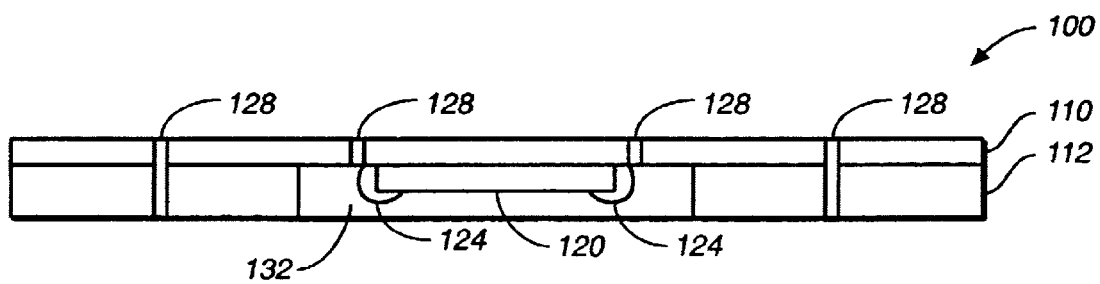
FIG._2b
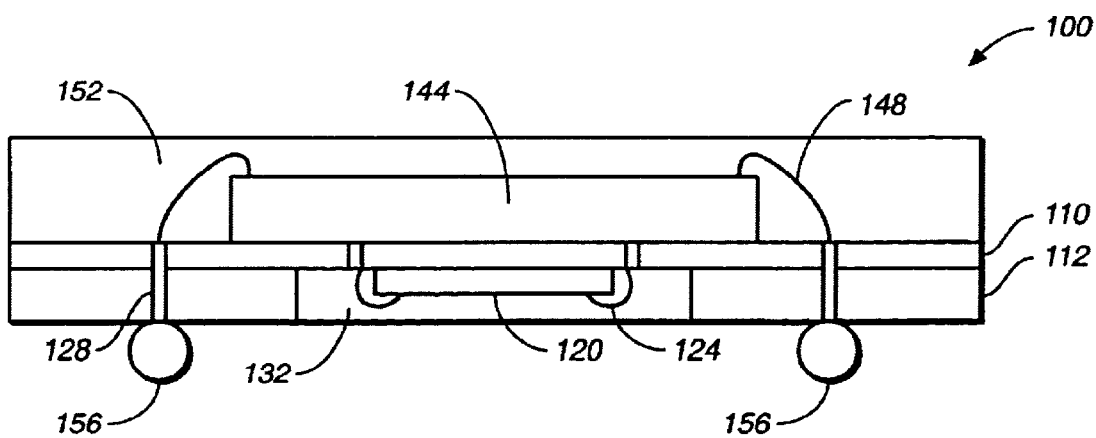
FIG._2c

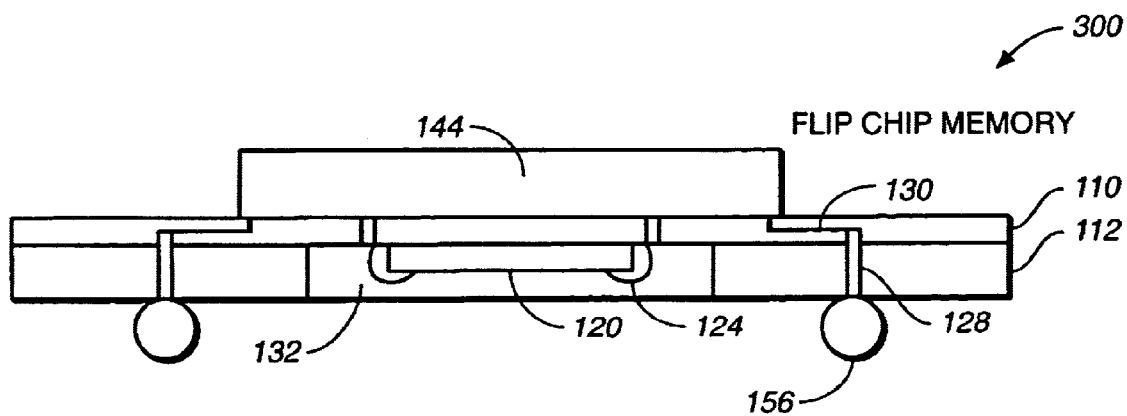
FIG._3
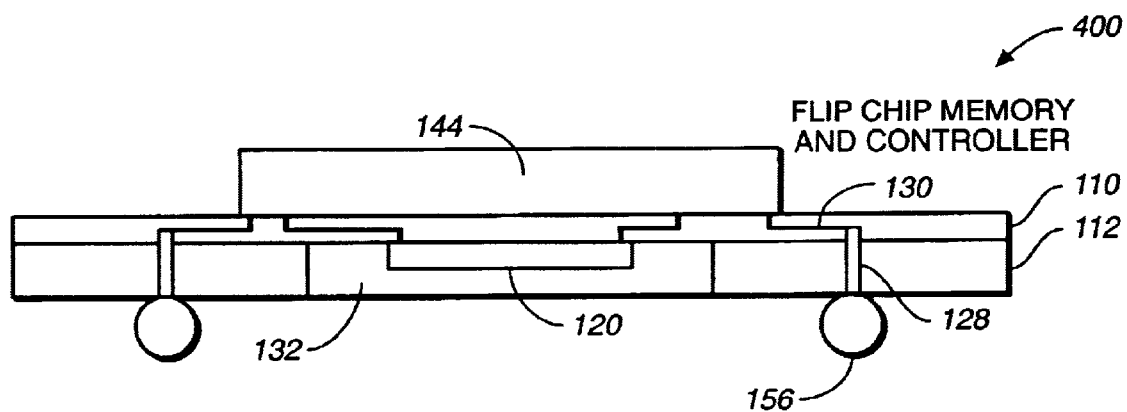
FIG._4

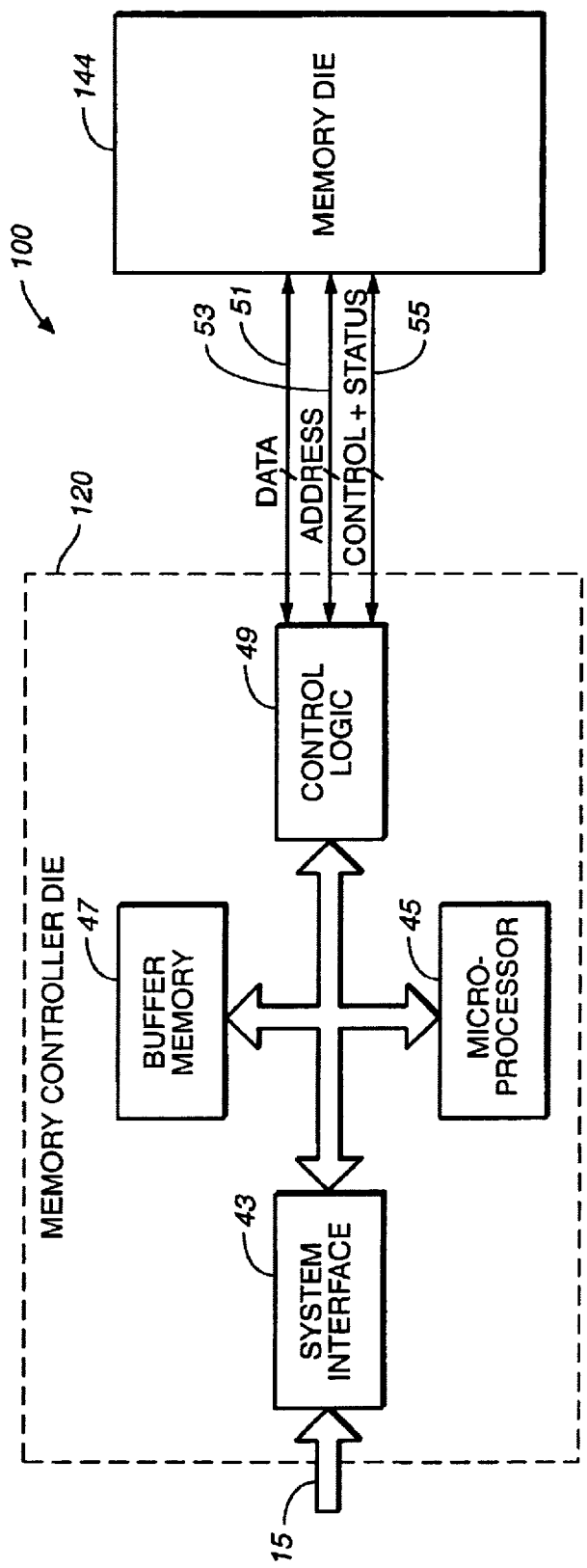
FIG._5
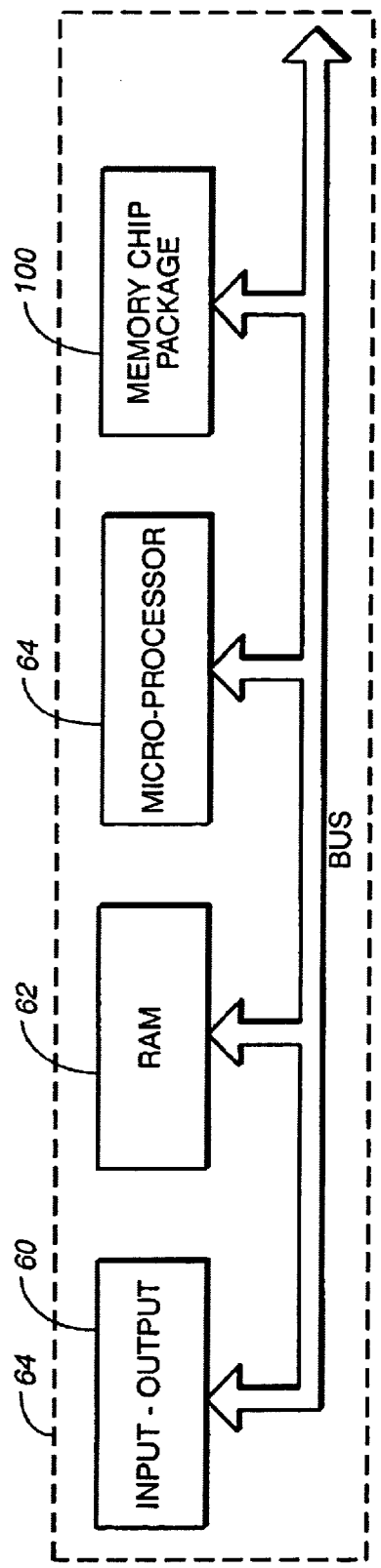
FIG._6

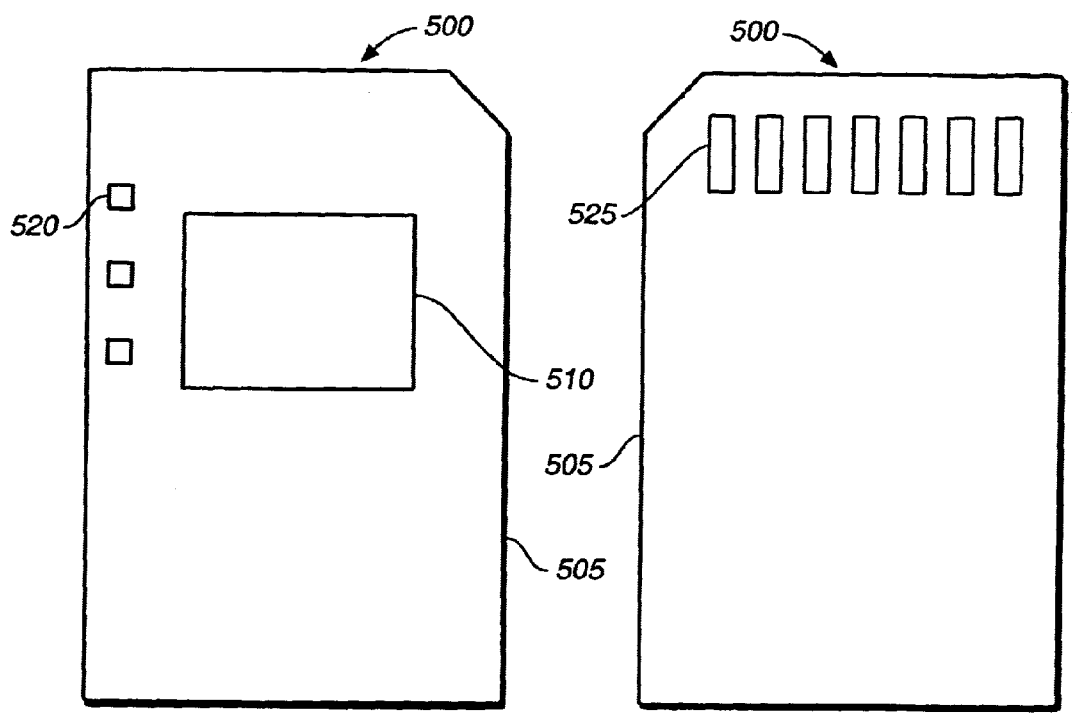
FIG._7a  FIG._7b
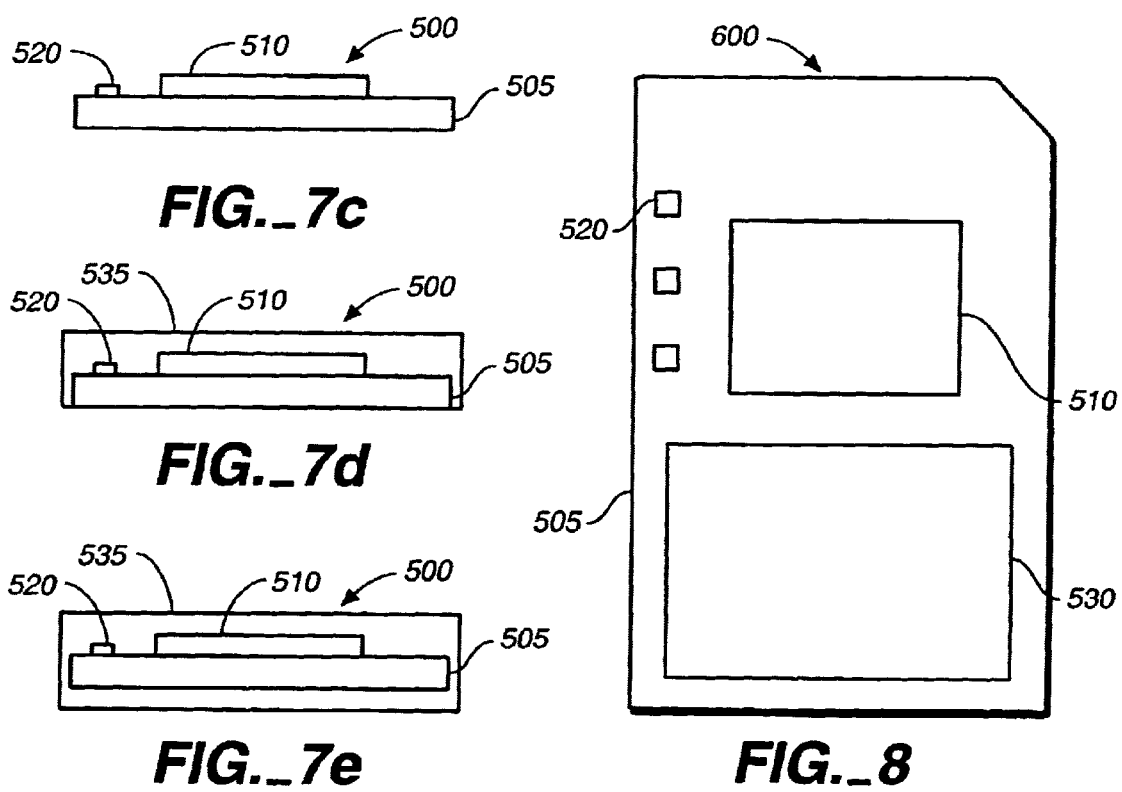
FIG._7c
FIG._7d
FIG._7e  FIG._8

MEMORY PACKAGE WITH A CONTROLLER ON ONE SIDE OF A PRINTED CIRCUIT BOARD AND MEMORY ON ANOTHER SIDE OF THE CIRCUIT BOARD

BACKGROUND OF THE INVENTION

1. Field of the Invention

The present invention relates to semiconductor memory chip packaging, and in particular to stacked multiple memory chip packages.

2. Discussion of the Related Art

Due to size limitations of printed circuit boards (PCB), only a finite number of packaged chips can be placed on a PCB. As the complexity of applications increases, a greater number of chips are needed on the PCB to implement the necessary functions, which would require larger size PCBs. However, it is also desirable to decrease the size of PCBs and devices containing PCBs. One method of achieving both these objectives is to increase the number of chips in a package, such as by stacking the chips, without increasing the planar area of the package. Stacking the chips can result in a smaller overall package footprint. However, stacking the chips directly on top of each other has its own drawbacks. When a chip is stacked upon a base chip, the base chip can be damaged in the process. Many different types of damage can occur including damage to the leads. Furthermore, while the footprint may be reduced, the height or aspect ratio is increased with the stacked chips.

SUMMARY OF THE INVENTION

Therefore, a need has arisen for a semiconductor chip package and packaging method that meets these challenges. One aspect of the invention is a memory package with a controller die on one side of a printed circuit board and a memory die on another side. Another aspect involves integrating the memory package into a memory card with optional additional memory. Yet another aspect is a microprocessor controlled device integrating the memory package with the controller die on one side of a printed circuit board and a memory die on the other side.

BRIEF DESCRIPTION OF THE FIGURES

FIG. 1 is a perspective view of multiple chip packages before fabrication.

FIGS 2a–c are cross sections of a chip package 100 at various stages of the fabrication process.

FIG. 3 is a cross section of chip package 300.

FIG. 4 is a cross section of chip package 400.

FIG. 5 is a schematic diagram of a chip package such as chip package 100, 300, or 400.

FIG. 6 is a schematic diagram of a device integrating a chip package such as chip package 100, 300, or 400.

FIG. 7a is a plan view of a first side of a memory card 500 formed with the memory chip package, another embodiment of the present invention.

FIG. 7b is a plan view of a second side of the memory card 500 shown in FIG. 7a.

FIG. 7c is a cross section of memory card 500 shown in FIGS. 7a and 7b.

FIG. 7d is a cross section of memory card 500 shown in FIGS. 7a and 7b.

FIG. 7e is a cross section of memory card 500 shown in FIGS. 7a and 7b.

FIG. 8 is a plan view of a memory card 600 formed with the memory chip package, another embodiment of the present invention.

DETAILED DESCRIPTION OF THE INVENTION

Memory chip packages that include a controller may be utilized in many diverse applications. In all of the applications space is at a premium, and long term reliability is essential. The packages can be integrated into complex embedded systems such as cell phones or any microprocessor controlled device, or the packages can also be used to make memory cards. A memory package according to the present invention generally comprises a memory die and a controller die to organize communication with external devices and to control the reading and writing of data to and from the memory locations of the memory die. The controller thus simplifies the reading and writing of data to the memory cells so that a device that integrates the package need only communicate with the controller with simple commands and need not directly access the memory cells with much more complicated signals. The functionality of the controller die and memory die will be discussed in greater detail later with regard to FIGS. 5 and 6.

The memory capacity per die is increasing rapidly. One die may have a capacity of anywhere from a few kilobytes to several megabytes. Some embedded applications may not require a high capacity whereas the storage of digital audio and images requires as high a density as can be achieved. The present package can be configured in many different capacities suitable for many different applications. The memory may be read only memory (ROM), random access memory (RAM), or flash type RAM. Currently the maximum capacity for a single flash memory die is roughly 64 megabytes. By the time this patent issues the same size die is predicted to hold over 256 megabytes of flash memory with an overall package size of 13×17 mm with a thickness of less than one mm.

Piggybacking the controller die on top of the memory die is known. Such an arrangement may lead to damage of either one or both of the die. Mounting the memory die on an opposite side of a printed circuit board avoids this potential damage, thus reducing the number of packages that must be scrapped after testing, and enhancing the long term reliability of those packages that pass the initial burn in test but may potentially fail during the lifetime of the product.

FIG. 1 illustrates an initial step in the formation of a group of memory packages. Two printed circuit boards 110 and 112 are laminated together before the assembly is saw cut into individual packages. The individual packages may be saw cut or sheared apart. Two of these packages 100a and 100b are labeled in FIG. 1. Within each of the PCB's are a number of conductive layers that are used to connect various components mounted on the PCB's to form a myriad of circuits. Printed circuit board (PCB) 112 has a group of rectangular or square holes 118 formed within it. These holes may be machined out of PCB 112 in any number of ways, or PCB 112 may be preformed with the holes.

FIGS. 2a–2c illustrate a cross section of the various stages of an individual package 100, for instance 100a or 110b of FIG. 1, during fabrication. Controller die 120 is mounted to PCB 110 within the rectangular hole of PCB 112, as shown in FIG. 2a. Alternatively, one PCB can be used in place of the two PCBs 110 and 112. In this case, PCB 110 would have a thickness approximately equal to both PCB 110 and 112 and a central recess for the controller would be formed within PCB 110. This central recess may be mechanically formed by a process such as milling or may be formed by selectively laminating layers with pre-formed cutouts.

FIG. 2b shows vias 128 that have been made through PCB 110 and PCB 112 to connect components on the top and bottom sides of the package 100. Bond wires 124 connect controller die 120 to vias 128. After the bond wires have been formed controller die 120 is encapsulated with encapsulent 132. Encapsulent 132 and 136 can be any substance well known in the art such as bakelite, phenolic, epoxy or a thermal setting compound.

In FIG. 2c, memory die 144 is mounted to the topside of PCB 110. Bond wires 148 connect the bond pads of memory die 144 with vias 128, some of which are intern connected to solder balls 156. Solder balls 156 are connected to vias 128 in order to later mount package 116a to another circuit board. Memory die 144 and bond wires 148 are then encapsulated with any well known material to form encapsulent 152. Encapsulent 152 has a flat top and square edges as it was one of multiple packages cut from a circuit board. However, the packages may be individually formed in which case the encapsulent 152 would taper down towards PCB 110 near the edges of package 100. Memory package 100 is about 0.7 mm thick without solder balls 156 and slightly less than one mm thick with solder balls 156. Circuit traces within PCB 110 can connect memory die 144 to controller die 120 through additional vias and bond wires (not shown), or can connect to flush mount contacts on the opposite or circuit board side of memory die 144 and controller die 120.

As an alternative to encapsulating the top and bottom sides (memory die 144 and controller die 120) in separate steps, the entire package can be transfer molded at the same time after the die have been mounted.

FIG. 3 illustrates a cross section of a memory package according to a second embodiment of the present invention. Memory package 300 is similar to memory package 100 described above except that memory die 144 is flip chip bonded to the top of PCB 110 and thus bond wires connecting the memory die to the circuit board are eliminated, thereby reducing the height of package 300 relative to package 100. The bonding pads or terminals of memory die 144 are conductively connected through vias and conductive layers of PCB 110 and 112 to controller die 120. Package 300 is shown without any encapsulent on the top side of PCB 110 and memory die 144, however, an encapsulent may be applied.

FIG. 4 illustrates a cross section of a memory package according to a third embodiment of the present invention. Memory package 400 is similar to memory package 300 but both memory die 144 and controller die 120 are flip chip bonded to PCB 110. Thus, conductive layers of PCB 110 are used to interconnect controller die 120 to memory die 144. Because no bond wires are present, package 400 has a very low aspect ratio, a very important feature for today's portable devices.

FIG. 5 is an electrical schematic of any of the chip packages described thus far, for instance controller die 120 and memory die 144 of chip package 100. The memory controller 100 includes appropriate system interface circuits 43 for interfacing with a computer system bus 15, a controller microprocessor 45, volatile buffer memory 47 for temporarily storing data being written to or read from the memory, and control logic circuitry 49. These circuit units are interconnected and under the control of the microprocessor 45. The EEPROM banks within memory die 144 are connected to the controller logic 49 over circuits including data lines 51, address lines 53 and control and status lines 55. Further details of the system illustrated in FIG. 5 can be had by reference to U.S. Pat. No. 6,081,447 to Lofgren et al., entitled "Wear Leveling Techniques for Flash EEPROM Systems," and to PCT Pat. No. WO 01/61703 A2 of the Sandisk Corporation, entitled "Flash EEPROM System with Simultaneous Multiple Data Sector Programming and Storage of Physical Block Characteristics in Other Designated Blocks," both of which are hereby incorporated by this reference in their entirety. U.S. Pat. No. 5,663,901 to Wallace et al., entitled "Computer Memory Cards Using Flash EEPROM Integrated Circuit Chips and Memory-Controller Systems," also describes the functionality of the controller in further detail, and is hereby incorporated by this reference in its entirety.

The EEPROM cells in memory die 144 can have either a NOR or NAND structure. For further information on the NAND structure and configuration please refer to U.S. Pat. No. 6,046,935 to Takeuchi et al. entitled "Semiconductor Device and Memory System," which is hereby incorporated in its entirety by this reference.

Depending on whether a NAND or NOR structure is employed, the arrays of rows and columns will differ and the data lines 51, address lines 53, and control and status lines 55 will have different configurations. However, generally speaking, data to be read or written into the specific memory cells will be transferred over data lines 51. The address of those specific memory cells will be transferred over address lines 53, and the status of the specifically addressed cells is transferred over control and status lines 55. For instance, the status of a memory cell after a write (program) operation may checked over control and status lines 55. These lines 51, 53, and 55 correspond to the bond wires 124 and vias 128 in the chip package 100 illustrated in FIGS. 2a–c, or to a combination of bond wires 124, vias 128, and circuit traces 130 in the flip chip packages 300 and 400 illustrated in FIGS. 3 and 4. The system interface circuits include solder balls 156 and bond wires 144, and may also include other bond wires and interconnects.

Any of the memory packages described above can be integrated as a component into any type of device 64 needing a thin memory package. A schematic of a typical embedded application of which a memory chip package of the present invention may be integrated is shown in FIG. 6. For instance, memory chip package 100 is shown connected by an electrical bus to input-output devices 60, RAM memory 62, and microprocessor 64. Device 64 may be any smart device such as a personal computer, portable organizer or music player, cell phone or any other device needing memory for storage of data.

The package can also be used in a memory card. FIG. 7a illustrates the first face of a memory card 500 formed from memory package 510 and optional passive devices 520 mounted on PCB 505. PCB 505 is a multi-layer circuit board and circuit traces are formed in a conductive layer (not shown) of PCB 505 to interconnect the memory package 510 and any other electronic components to contacts 525. The passive devices are, for example, charge pumping capacitors used to convert a supplied voltage to a larger voltage required to modify the flash memory of the memory package 510 or any other memory that may be integrated into card 500. Passive devices 520 may not be present as separate components of memory card 500 if they are integrated into memory package 510. If this is the case, then memory package 510 would contain all the circuit components of memory card 500 aside from electrical circuit traces, a portion of which can be used as test contacts, and contacts 525 on the opposite face of the memory card 500 shown in FIG. 7b. FIG. 7c is a cross section of memory card 500 showing memory package 510 and passive devices 520 upon PCB 505. FIG. 7d is a cross section illustrating a plastic cover 535 extending over the face and sides of the memory card having package 510 and optional passive devices 520. FIG. 7e illustrates an embodiment of memory card 500 wherein the cover 535 extends all around the memory card. In this case, cover 535 includes cutouts or voids where contacts 525 are located on the opposite face of PCB 505.

For further information on memory cards and packages, see U.S. Pat No. 6,040,622, issued Mar. 21, 2000, by Robert F. Wallace, entitled "Semiconductor Package Using Terminals Formed on a Conductive Layer of a Circuit Board," which is hereby incorporated by this reference in its entirety.

FIG. 8 illustrates the first face of memory card 600 comprising memory package 510 and an additional memory die 530 mounted to the circuit board. Memory die 530 may be any type of memory and provides additional storage capacity for memory card 600. The controller present in memory package 510 will be used to access the information in additional memory die 530.

While particular embodiments of the present invention and their advantages have been shown and described, it should be understood that various changes, substitutions, and alterations can be made therein without departing from the spirit and scope of the invention as defined by the appended Claims.

What is claimed is:

1. A memory package comprising:
   a first circuit board having two faces, the first circuit board comprising a memory die on a first face of the circuit board and a controller die on the second face;
   a second circuit board having two faces and an opening, the first face of the second circuit board affixed to the second face of the first circuit board such that the controller die is within the opening; and
   vias connecting the memory die to the second face of the second circuit board, and connecting the memory die to the controller die.

2. The memory package of claim 1 further comprising a first encapsulant covering the memory die and a portion of the first circuit board.

3. The memory package of claim 1 further comprising a second encapsulant covering the controller die.

4. The memory package of claim 1 wherein the thickness of the package is about 0.7 millimeters.

5. The memory package of claim 1 further comprising bond wires, the bond wires connecting the memory die and the controller die to the vias or a conductive layer of the first circuit board coupled to the vias.

6. The memory package of claim 1, wherein the memory die is conductively affixed to a conductive layer of the first circuit board without the use of bond wires.

7. The memory package of claim 1, wherein the controller die is conductively affixed to a conductive layer of the first circuit board without the use of bond wires.

8. The memory package of claim 1, wherein the memory is FLASH type memory.

9. The memory package of claim 1 further comprising a set of contacts on either the first or second circuit board, the set of contacts exposed.

10. The memory package of claim 1 further comprising solder balls on the second face of the second circuit board, the solder balls affixed to the vias.

11. The memory package of claim 10, wherein the thickness of the package including the solder balls is about 1.0 millimeters.

12. A memory package comprising:
    a circuit board having a first and second face, the second face having a recess;
    a memory die attached to the first face of the circuit board, the memory die positioned above the recess;
    a controller die attached to and positioned within the recess of the second face of the circuit board, the second face of the circuit board forming a second face of the package; and
    vias connecting the memory die to the second face of the circuit board.

13. The memory package of claim 12 further comprising bond wires, the bond wires connecting the memory die and the controller die to the vias or a conductive layer of the circuit board coupled to the vias.

14. The memory package of claim 12, wherein the memory die is conductively affixed to a conductive layer of the circuit board without the use of bond wires.

15. The memory package of claim 12, wherein the controller die is conductively affixed to a conductive layer of the circuit board without the use of bond wires.

16. The memory package of claim 12, wherein the memory is FLASH type memory.

17. The memory package of claim 12 further comprising a set of contacts on a face of the circuit board.

18. The memory package of claim 17 further comprising an encapuslent around the first face and edges of the package.

19. The memory package of claim 17 wherein the contacts are on the second face of the circuit board.

20. The memory package of claim 19, further comprising a plastic covering over the first and second face and the edges of the package.

21. A memory card comprising:
    a first circuit board having a first and second face;
    a memory package comprising a second circuit board, a controller die attached to first face of the second circuit board, and a memory die attached to a second face of the second circuit board, and wherein
    the memory package is attached to the first face of the first circuit board; and a set of contacts on the second face of the first circuit board.

22. The memory card of claim 21 further comprising a set of circuit traces within the first circuit board coupled to the memory die, controller die, and the set of contacts.

23. The memory card of claim 22 wherein the circuit traces are coupled to the memory die, controller die, and the set of contacts with vias.

24. The memory card of claim 21 further comprising a cover extending over the first face and edges of the circuit board.

25. The memory card of claim 24 wherein the cover further extends over the second face of the circuit board, the cover having openings for the set of contacts.

26. A microprocessor controlled device comprising:
    a memory chip package comprising a circuit board having a first and second face, a controller die attached to the first face, and a memory die attached to the second face;
    one or more input-output devices;
    random access memory; and
    a microprocessor.

27. A memory chip package comprising:
    a circuit board having first and second opposing faces;
    a FLASH EEPROM having memory cells, the EEPROM attached to the first face of the circuit board;
    a controller having a control logic, the controller attached to the second face of the circuit board and configured to read and write data to the memory cells on the first face; and
    data lines connecting the controller die to the EEPROM and operable to transfer data to and from the memory cells.

28. The memory chip package of claim 27 wherein the controller further comprises:
    a microprocessor;
    a memory buffer; and
    a system interface.

29. The memory chip package of claim 27 further comprising:
    address lines connecting the memory cells on the first face to the controller on the second face, the address lines operable to address one or more memory cells for the reading and writing of the data.

30. The memory chip package of claim 29 further comprising:

control and status lines connecting the memory cells on the first face to the controller on the second face, the control and status lines operable to monitor the state of the memory cells over the control and status lines.

* * * * *